March 22, 1966 LEE ROY BROWN 3,242,436
AUDIO VOLUME COMPRESSOR CIRCUIT IN AN AMPLIFIER CIRCUIT
Filed Feb. 5, 1962
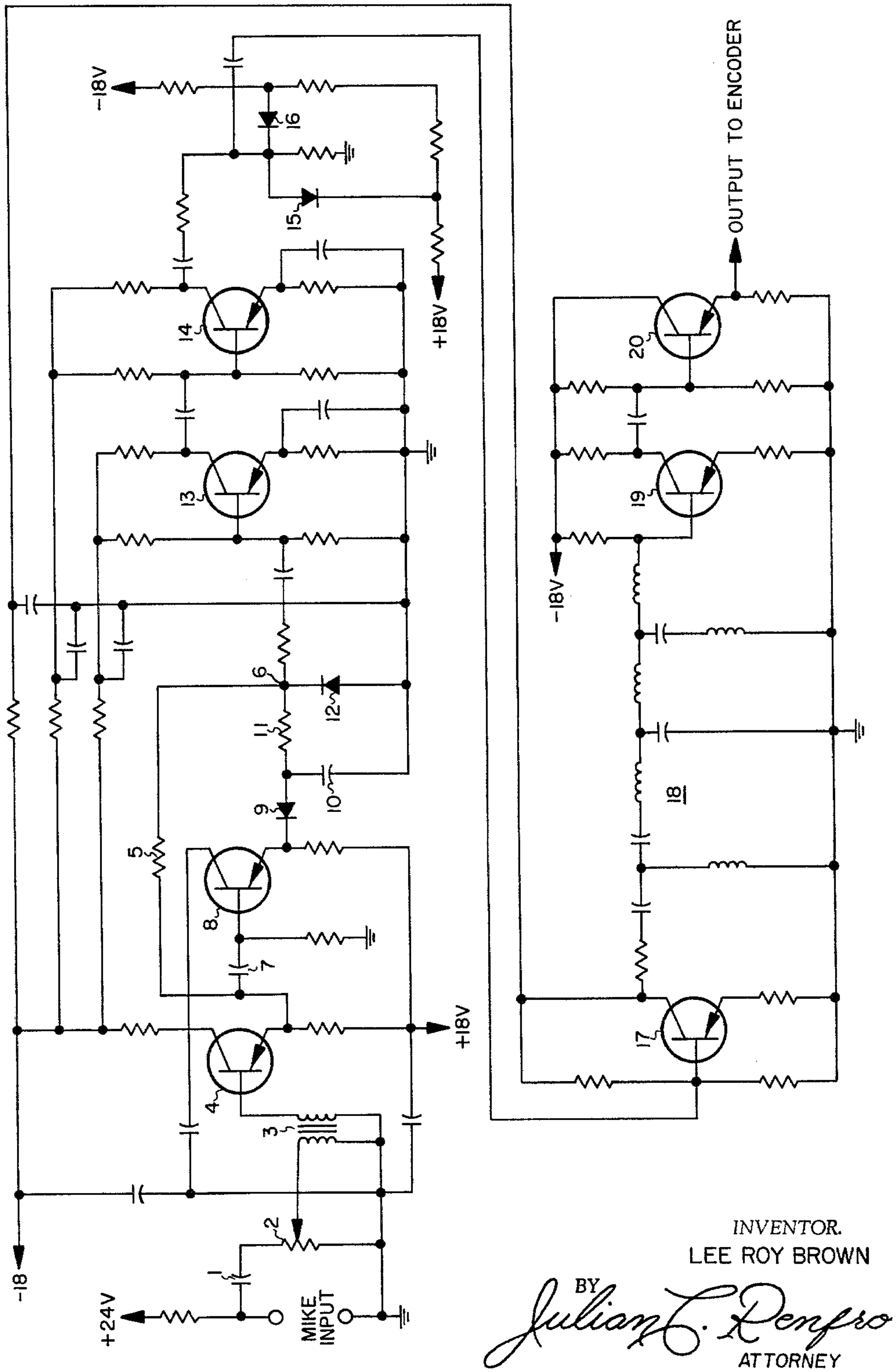
INVENTOR.
LEE ROY BROWN
BY Julian C. Renfro
ATTORNEY

United States Patent Office 3,242,436

Patented Mar. 22, 1966

3,242,436

AUDIO VOLUME COMPRESSOR CIRCUIT IN AN AMPLIFIER CIRCUIT

Lee Roy Brown, Orange County, Fla., assignor to Martin-Marietta Corporation, Middle River, Md., a corporation of Maryland

Filed Feb. 5, 1962, Ser. No. 170,938

3 Claims. (Cl. 330—24)

This invention relates to audio volume compressor circuitry and more particularly to an audio compressor circuit having a very small attack time.

In many applications it is desirable to provide circuitry which produces a constant level output signal in response to an audio input which may vary significantly in level. One example of such an application is in a communication system in which an audio input is being encoded into a digital form for transmission. The level of the audio input may vary significantly as the operator's voice varies in volume or as the microphone is held closer to or further away from the speaker. It is necessary to convert such variable level audio to a constant level which may be applied to the encoder.

Circuits using automatic gain control have been used for this purpose. These circuits are not entirely suitable for all purposes. If the signal is of insufficient level in relation to noise, automatic gain control circuits do not operate properly.

In order to obviate this difficulty, volume compressor circuits have been developed. These circuits utilize the negative resistance characteristics of a passive element such as a diode to maintain a constant level output signal. An example of such a circuit is shown in Electronics, January 8, 1960, page 62.

Prior art volume compressor circuits have been found unsuitable for applications such as the encoding of audio speech referred to above. In these circuits the audio is rectified and is used to charge a capacitor. The voltage across this capacitor determines the resistance of the negative resistance device and the resistance of this device sets the level of the output. It has been found that if the time required to charge the capacitor to the proper level is significant, the compressor circuitry does not accurately follow changes in the input level. This charging time, referred to as the attack time, must be kept quite low. In the encoder application it is desirable to have an attack time approaching 1 millisecond. Prior art circuits are incapable of such operation.

Accordingly, it is an object of the present invention to provide an improved audio compressor circuit having a very low attack time.

In accordance with one embodiment of the invention, the audio signal is coupled through a first emitter follower transistor to the output in series with a resistor having a high resistance. The emitter of this first emitter follower is also connected to the base of a second emitter follower which provides the compressor signal. The output of the second emitter follower, which has a low output resistance, is rectified and the resultant signal charges a capacitor. A negative resistance diode is connected across this capacitor and is connected to the output. As the voltage across the capacitor increases, the resistance of the diode decreases. This provides a lower impedance shunt for the output signal across the high resistance signal source and accordingly reduces the level of the output signal.

These and other objects, features and advantages of the invention will be more apparent from the following more detailed description and appended claims together with the single drawing which shows a schematic of the audio circuitry including the audio compressor.

Referring now to the drawing, the microphone input is applied through input capacitor 1, level setting resistor 2 and input transformer 3 to the base of transistor 4. This transistor 4 is connected in an emitter follower configuration. The emitter is connected through a resistor 5 to the output of the compressor circuit at 6, causing this emitter follower to have a high output resistance.

In order to drive a level setting compressor signal, the emitter of transistor 4 is coupled through capacitor 7 to the base of transistor 8. The audio at the emitter of transistor 8 is rectified in diode 9 and the resultant signal charges the capacitor 10. It is quite important to note that the time constant of the circuit which is charging capacitor 10 includes only the dynamic output resistance of the emitter follower utilizing transistor 8 and associated components, and the forward resistance of diode 9. Both of these resistances are quite small. Consequently, the voltage on capacitor 10 changes quite quickly in response to changes in the audio input level.

The voltage across capacitor 10 is connected through resistor 11 to the negative resistance diode 12. As the voltage across capacitor 10 increases the resistance of diode 12 decreases. Consequently, the diode 12 provides a lower impedance shunt for the output at 6 and reduces the level of this output.

For convenience, the remainder of the audio circuitry has been shown. This includes an audio amplifier 13, a limiter including transistor 14 and diodes 15 and 16, audio amplifier 17, filter 18, audio amplifier 19 and output driver 20.

The circuit described above provides an attack time approaching the desired one (1) millisecond. Another desirable characteristic of such a circuit is that the circuit have a hold time of approximately 1 second. This is the time which the capacitor will hold its charge at a given level. The above circuit was found to have a hold time of approximately 1.2 seconds.

The compression characteristics of the above circuit are quite desirable as shown in Table 1 below.

Compression (Reference: 0 db at 1 v. P–P output. $f$=1000 c.p.s.)

| Input (db) | Output (db) | Compression (db) |
|---|---|---|
| 0 | 0 | ---------- |
| 10 | 10 | ---------- |
| 15 | 14.7 | 0.3 |
| 20 | 19 | 1 |
| 25 | 20 | 5 |
| 30 | 20 | 10 |
| 35 | 20 | 15 |
| 41 | 21 | 20 |

The following components were found particularly suitable for use in the above circuit. It will be understood, of course, that these components are merely given by way of example and are not to be considered as limiting of the invention.

| | |
|---|---|
| Capacitor **1** | 10 mfd., 20 v. |
| Resistor **2** | 500 ohms. |
| Transformer **3** | UTC SSO-1. |
| Transistor **4** | 2N43A. |
| Resistor **5** | 910K. |
| Capacitor **7** | 10 mfd., 25 v. |
| Transistor **8** | 2N43A. |
| Diode **9** | 1N457. |
| Capacitor **10** | 22 mfd., 20 v. |
| Resistor **11** | 75K. |
| Diode **12** | 1N64. |
| Transistor **13** | 2N404. |
| Transistor **14** | 2N404. |
| Diode **15** | 1N277. |
| Diode **16** | 1N277. |
| Transistor **17** | 2N404. |
| Transistor **19** | 2N404. |
| Transistor **20** | 2N404. |

While a particular embodiment of the invention has been shown and described, it will, of course, be understood that various modifications may be made without departing from the principles of the invention. The appended claims are, therefore, intended to cover any such modifications within the true spirit and scope of the invention.

I claim:

1. Compressor circuitry producing constant level signals at the output in response to a variable level audio signal at the input comprising a first transistor, said input being coupled to the base of said first transistor, the emitter of said first transistor being coupled to said output so that said audio signals appear at said output, a second transistor, the emitter of said first transistor being coupled to the base of said second transistor, a source of operating potential connected to the collectors of said transistors, a first diode, a capacitor, the emitter of said second transistor being connected to one electrode of said diode, the other electrode of said diode being connected to said capacitor and to an isolating resistor, said capacitor being disposed in a charging path whose time constant is determined by the dynamic output impedance of said second transistor, the impedance of said diode, and the impedance of said capacitor, said capacitor being charged to a D.C. voltage proportional to the average level of the variable level audio signal appearing at the input, a second, negative resistance diode, latter diode being effectively connected across said capacitor by virtue of a connection through said isolating resistor, whereby the voltage on said capacitor controls the impedance of said second diode in a manner inversely proportional to the magnitude of such voltage on said capacitor, whereby decreasing impedance of said second diode decreases the level of the output signal in response to an increasing D.C. voltage on said capacitor.

2. The circuitry recited in claim 1 wherein said input is coupled to the base of said first transistor through an input transformer, the emitter of said first transistor is coupled to said output through a resistor and the emitter of said first transistor is coupled to the base of said second transistor through a capacitor.

3. Compressor circuitry for producing constant average level audio signals at output terminals in response to variable average audio level input comprising cascaded first and second amplifier means, said first amplifier means having an input portion connected to receive audio input to said compressor circuitry, and said second amplifier means having an input portion connected to receive the output from said first amplifier means, said first amplifier means having a high output impedance and said second amplifier means having a low output impedance, voltage controllable negative resistance means effectively in shunt with output terminals of said high impedance first amplifier means, audio signal rectifying means connected to output terminals of said low impedance second amplifier means, capacitor means connected to said rectifying means to bring about the charging of said capacitor by the rectified audio signal in a time determined collectively by the output impedance of said second amplifier means, the impedance of said rectifier means, and the impedance of said capacitor, whereby a D.C. voltage appears on said capacitor proportional to the average level of said variable audio level signal appearing at said input of said compressor circuit, said capacitor being operatively connected across said voltage controllable negative resistance means by virtue of a connection through an isolating resistor so that such D.C. voltage controls the impedance of said negative resistance means in a manner inversely proportional to the magnitude of such D.C. voltage, said negative resistance means thereby decreasing the level of such output signal in response to an increasing D.C. voltage of said capacitor and increasing the level of such output signal in response to a decreasing voltage of said capacitor.

References Cited by the Examiner

Richings et al. Transistorized Sound Level Meter, "Electronics," June 17, 1960, pp. 64–66.

ROY LAKE, *Primary Examiner.*

NATHAN KAUFMAN, *Examiner.*